United States Patent [19]

Kuckes et al.

[11] Patent Number: 4,845,434
[45] Date of Patent: Jul. 4, 1989

[54] MAGNETOMETER CIRCUITRY FOR USE IN BORE HOLE DETECTION OF AC MAGNETIC FIELDS

[75] Inventors: Arthur F. Kuckes; Bruce G. Thompson, both of Ithaca, N.Y.

[73] Assignee: Vector Magnetics, Ithaca, N.Y.

[21] Appl. No.: 147,184

[22] Filed: Jan. 22, 1988

[51] Int. Cl.⁴ .................. G01V 3/26; G01V 3/20; G01V 3/40; G01R 33/04
[52] U.S. Cl. .................. 324/346; 166/66.5; 324/247; 324/253
[58] Field of Search .......... 324/338, 339, 346, 247, 324/253-255; 166/66.5; 175/40, 45, 50

[56] References Cited

U.S. PATENT DOCUMENTS

| | | | |
|---|---|---|---|
| 3,187,252 | 6/1965 | Hungerford | 324/346 X |
| 3,369,174 | 2/1968 | Groenendyke et al. | 324/346 |
| 4,293,815 | 10/1981 | West et al. | 324/346 X |
| 4,323,848 | 4/1982 | Kuckes | 324/346 X |
| 4,372,398 | 2/1983 | Kuckes | 324/346 X |
| 4,502,010 | 2/1985 | Kuckes | 324/346 X |
| 4,700,142 | 10/1987 | Kuckes | 324/346 |

Primary Examiner—Gerard R. Strecker
Attorney, Agent, or Firm—Jones, Tullar & Cooper

[57] ABSTRACT

A system for measuring X and Y vector components of a composite magnetic field including static portions such as those produced by the earth's magnetic field, and time varying portions such as those produced by current flowing in a target anomaly to thereby permit determination of the distance and direction from a sensor to the anomaly is disclosed. Highly sensitive fluxgate magnetometers sense total field X and Y axis vector components of the composite magnetic field of interest and produce output signals which are fed through corresponding detector and null circuits to produce total field signals corresponding to the components being measured. These total field component signals are fed through corresponding signal conditioning circuits to equalize the time varying and static field portions of the signal components. Thereafter, the X and Y axis equalized signals are supplied by way of a multiplexer and an analog to digital converter to suitable transmission circuitry which transmits the digital signals via a wireline to a receiver. At the receiver, the signals are decoded and supplied to a computer for deconvolving and for determination of the distance and direction to the anomaly from the sensor.

8 Claims, 3 Drawing Sheets

MAGNETOMETER CIRCUITRY FOR USE IN BORE HOLE DETECTION OF AC MAGNETIC FIELDS

BACKGROUND OF THE INVENTION

The present invention is directed, in general, to well logging techniques using injected alternating current to produce time varying magnetic fields having characteristics which correspond to anomalies within the earth, and to apparatus for determining the location of such anomalies with respect to a well being drilled. More particularly, the invention is directed to flux gate magnetometers for detecting the total magnetic field in the earth, to improved systems and circuitry for producing electric signals corresponding thereto, and to circuitry for analyzing the signals to determine the distance and direction from a well being drilled to an anomaly.

The detection of magnetic fields within boreholes or wells for the purpose of analyzing surrounding earth formations or nearby bodies within the earth has a long history; a large number of patents have issued and numerous articles have been published on various devices and techniques for carrying out such analysis. Many of the known procedures have been concerned with the measurement of essentially static; i.e., time independent, magnetic fields such as the earth's magnetic field or the fields which are produced by the magnetic characteristics of various anomalies that occur in earth's formations. In addition, numerous patents and publications have been directed to the measurement of time varying magnetic fields produced by impressed alternating currents flowing in the ground. For example, U.S. Pat. Nos. 1,902,265 and 2,261,563, both to Rieber, disclose the use of low frequency alternating currents injected into the earth to detect anomalies in the earth's conductivity and to locate geological formations having a conductivity different from that of the surrounding formation. The electrical current is passed through the earth, and the magnetic fields produced by this current are mapped by means of a magnetometer at the earth's surface. In both patents, electrodes are used to inject the current, and in the '563 patent, one of the electrodes is a drill which penetrates deeply into the earth. Measurement of the signals is obtained by a manual nulling technique.

U.S. Pat. No. 1,803,405 to Ricker illustrates that electromagnetic fields produced by alternating currents have been used to locate masses, such as metallic ore bodies, beneath the earth's surface wherein such masses have electrical constants which were different from the constants of the surrounding earth. The magnetic field produced by an alternating current flow through the earth is detected, in the Ricker patent, by means of an induction coil which is mounted for rotation on the surface of the earth so that measurements can be made in different directions. A magnetic compass is affixed to the coil for orientation purposes. Similar induction coil detectors for measuring varying magnetic fields within the earth are illustrated in U.S. Pat. No. 2,359,894 to Brown et al and U.S. Pat. No. 2,291,692 to Cloud. In both of these patents, the magnetic field to be measured is produced by an alternating current injected into the earth either by a coil or by electrodes, but the induction coil detectors are located in boreholes, rather than on the surface. In Brown et al, the outputs of the induction coils are amplified downhole, and the signals are supplied to a receiver at the surface, while in Cloud the coil outputs are amplified at the surface.

U.S. Pat. No. 2,273,374 to Williams discloses apparatus for electromagnetic exploration of the earth from a borehole wherein two electrodes are positioned in a vertical borehole at spaced locations. A low frequency alternating current voltage is passed through the earth in the vicinity of the borehole from these electrodes and a pair of magnetic field sensors arranged at right angles to each other and to the axis of the device are positioned in the hole below the electrodes to detect alternating magnetic fields produced by the injected current. Measurement of the amplitude and phase of the voltages obtained from the two sensors permits determination of the amplitude, phase, and relative direction with respect to the sensors of the alternating horizontal magnetic field vector resulting from a conductive anomaly in the earth. In order to determine the azimuthal direction of the anomaly, the compass direction of the axes of the sensors must be known, and for this purpose an orientation device such as a compass is also provided by Williams.

U.S. Pat. No. 3,369,174 to Groenendyke et al discloses a logging system wherein a time-varying magnetic field is produced in the earth surrounding a borehole, and a magnetometer is used to measure the total magnetic field encountered in the borehole as the magnetometer is moved along the length of the hole. The output of the magnetometer includes components produced by the earth's magnetic field, by the artificially created time varying magnetic field, and by modulations of those fields caused by the motion of the logging tool. These output signals are fed to surface instrumentation which separates the signals representing the artificially created time-varying field from the signals representing the earth's field and varying formation fields. The time-varying field signal is a composite signal having components which are separated to obtain the desired information concerning the formations being measured.

A further teaching of the use of fluxgate magnetometers for detecting an artificially created magnetic field within the earth is illustrated in U.S. Pat. No. 3,406,766 to Henderson. This patent discloses the use of two fluxgates positioned at right angles to each other, with the downhole package including suitable electronics for actuating the fluxgates and for amplifying the signals received therefrom. The orientation of the two fluxgates allows measurement of X and Y components of the total magnetic field to provide a measure of the distance and the direction to a target. U.S. Pat. No. 3,731,752 and U.S. Pat. No. 3,701,007, both to Schad, are similar to Henderson in showing the use of magnetometers for measuring the total magnetic field in a borehole for the purpose of locating a target source. In the Schad patents, downhole electronics are provided to drive the magnetometers and to separate the signals representing the earth's magnetic field from signals representing a superimposed alternating magnetic field, and surface instrumentation provides a measure of these fields. In both the Henderson and Schad patents, the target to be located is a magnetic field having its source in a second borehole.

U.S. Pat. No. 3,745,446 to Norris discloses a logging technique for locating the tops of buried well casings. This device utilizes a pair of vertically spaced magnetometers which are mounted in a test borehole for rotary motion so as to sweep the magnetometers through a full circle to detect the static magnetic fields surrounding the test hold. By summing the output signals of the spaced magnetometers and plotting the result, the gradient of the magnetic field having as its source a buried casing is obtained, and this value is plotted to obtain an indication of the depth of that casing as well as its distance and direction from the test borehole.

U.S. Pat. No. 3,510,757 to Huston discloses an induction coil array for determining the X and Y components of the magnetic fields present in the region of the borehole. Variations in the conductivity of earth formations due to anomalies in the formations cause variations in the flow of current produced by a down-hole transmitting coil driven by an AC input, and thus in the secondary magnetic fields generated thereby, and these magnetic fields are detected by the induction coil array. A compass, which may be a fluxgate device, provides information concerning the orientation of the receiving coils so that the direction to the source of a magnetic field produced by an anomaly can be determined. The outputs from the induction coils are amplified in a downhole electronics package, the signals are detected in a phase sensitive detector, and the detected signals are sent uphole for further processing.

U.S. Pat. No. 4,072,200 to Morris et al discloses a survey system for locating target subterranean bodies exhibiting a static magnetic field, a time varying magnetic field, or an electric field. The device includes four sensors, the first two being perpendicular to the axis of the survey tool for measuring X and Y components of static magnetic fields produced, in part, by the remanent magnetism of a target subterranean body, and the other two being spaced apart and aligned with each other along the longitudinal axis of the tool for measuring the gradient of the static field along a borehole. In addition, a single AC sensing coil is carried by the tool to detect and measure alternating magnetic fields produced at a target body. In the Ac mode of operation, the direction to the target is determined by selecting the orientation of the instrument so that a minimum response is detected by the AC sensing coil. The output from the AC sensor is amplified and transmitted to surface instrumentation, where the AC signals are converted to DC and fed to a calculator. Output signals representing the static fields are obtained from the static field sensors via suitable detector and amplifier circuitry, and are also transmitted to the surface calculator.

U.S. Pat. No. 3,791,043 to Russell discloses an instrument for measuring the inclination and direction of a borehole. The device uses fluxgate sensors for measuring the components of the earth's magnetic field, and in the preferred form of the invention, three mutually perpendicular fluxgate magnetic sensors are used. When the instrument is used in deep boreholes, the measured data are transmitted to the surface by means of pulse code transmission U.S. Pat. Nos. 4,323,848, 4,372,398, 4,443,762, 4,529,939 and 4,700,142, all of which issued to Arthur F. Kuckes, are directed to apparatus and techniques for measuring time varying magnetic fields in boreholes, and more particularly to the use of magnetometers of measuring the X and Y components of such fields. In U.S. Pat. No. 4,323,848, X and Y components of a time varying magnetic field and X and Y components of the earth's magnetic field are measured, the time varying field being generated by current flow in the earth produced by an AC source at the earth's surface. The outputs from induction coil time varying magnetic field sensors and from static magnetic field sensors are supplied sequentially to a voltage controlled oscillator for transmission to the surface.

The separate measurements of a time varying magnetic field and of the earth's magnetic field described in the '848 patent and in other patents disclosing such field measuring systems as discussed above result in large differences in output signal levels from the respective sensors, for the earth's magnetic field normally is very large compared to AC magnetic fields being detected. Separate amplifiers and filters are used in such systems to transmit these output signals to the surface, but such systems allow drift, such as might be due to temperature changes within the borehole, aging of components, and the like, to affect the signals differently over a period of time so that inaccuracies can occur.

In U.S. Pat. No. 4,372, 398, fluxgate magnetometers are used as magnetic field sensors, and current injecting electrodes are provided in the borehole to produce a time varying magnetic field at a target anomaly. In one embodiment, four magnetometers produce four analog output signals, two representing the X and Y axes of the total sensed magnetic field, respectively, and two outputs representing the X and Y axes of the earth's magnetic field, respectively. The sum of the X axis outputs, which represents the composite X axis field component, and the sum of the Y axis outputs which represents the composite Y axis field component, drive corresponding X and Y axis voltage controlled oscillators which transmit the respective X and Y composite signals to the surface for processing. Surface instrumentation demodulates the X and Y signals and analyzes the waves to determine the distance and direction to the source of the time varying magnetic field at the target anomaly. In this system, the X axis and the Y axis signals are transmitted to the surface on separate wires, so that two signal transmission lines are required. Furthermore, the disparity between the extremely low amplitude of the alternating current field and the relatively high amplitude of the earth's magnetic field makes it difficult to reliably track the alternating current field, thus effectively reducing the sensitivity of the device. The use of voltage controlled oscillators also can reduce the accuracy of the device because such oscillators are sensitive to high temperatures.

Although the art of deep well magnetic logging is highly developed, as indicated above, the many devices described above operate with varying degrees of success. Those devices which do not provide electronic circuitry in the borehole to filter and boost the output signals from the magnetic field sensors are limited in the depth at which they can be used effectively, for any need to send very small signals along the downhole cables without amplification severely limits the available sensitivity of the devices. On the other hand, it has been found that the environmental conditions in deep boreholes are detrimental to electronic circuits, and the use of amplifiers, oscillators, and the like is severely compromised by temperature variations and other ambient conditions so that the processing and transmission of analog signals can introduce numerous uncertainties and errors.

The high sensitivity and large dynamic range of fluxgate magnetometers provides a significant advantage to the use of such sensors, particularly in applications where subterranean targets are to be located at long distances and under adverse environmental conditions. However, before these characteristics can be used to advantage, there is a need to provide a significant increase in the sensitivity, accuracy and reliability of the circuitry used for handling the signals produced by such devices. There is a particular problem in borehole operations such as drilling of relief wells for the location of blowouts, for the depths at which the magnetic field sensors are used can be in excess of 15,000 feet and the adverse conditions in such wells severely degrade the operation of the electronic circuits and this adversely affects the measurements being made. Thus, these conditions often cause circuit noise and drift which mask low level signals, limiting the range of the sensor device and reducing its accuracy. Furthermore, where an impressed time varying magnetic field is to be detected at large distances, the desired field is usually very small in comparison to the earth's magnetic field, and because of this disparity, the measuring circuitry often cannot provide accurate and reliable measurements of both the time varying magnetic field and the static magnetic field.

SUMMARY OF THE INVENTION

It is, therefore, an object of the present invention to provide a fluxgate magnetometer system for borehole surveying which effectively utilizes the sensitivity and wide dynamic range of such magnetometers.

It is a further object of the invention to provide a borehole survey instrument for detecting extremely small time varying magnetic field signals which are superimposed on an essentially static magnetic field such as the earth's magnetic field, so as to permit continuous monitoring the time varying field.

It is a still further object of the present invention to provide a system for monitoring time varying magnetic fields which are extremely small with respect to background or ambient fields such as the earth's magnetic field and for reliably and accurately transmitting the measured signals from a deep borehole to surface processing equipment.

In accordance with the invention, an improved apparatus and system for borehole surveying to locate subterranean electrically conductive anomalies includes at least one electrode for injecting into the earth a current having a predetermined time-varying characteristic to thereby produce a corresponding time varying current at a target location. The current at the target produces in the surrounding earth a corresponding imposed magnetic field which varies in accordance with the time-varying characteristic of the current. This time variation may be produced, for example, by an alternating current in the range of about 0.1 to 10 Hz, so that the target current produces a varying imposed magnetic field which is distinct from the background, or ambient, magnetic fields. Although the earth's magnetic field is known to vary slowly over time, this variation is at a very low frequency, and for purposes of this disclosure the earth's magnetic field may be considered to be essentially static, and is the principal component of the background magnetic field. The total magnetic field at a point of measurement includes the imposed time-varying magnetic field produced by the injected current, and also includes other time-varying magnetic fields which may be present, together with any background static magnetic fields. This total field is detected, in accordance with a preferred form of the present invention, by a sonde, or survey tool, incorporating two fluxgate magnetometer devices having sensors arranged at right angles to each other, with the sensors also being perpendicular to the longitudinal axis of the sonde. The sonde is carried on a wireline by which it is lowered into a well or borehole where a large number of measurements of the total magnetic field in the plane of the sensors within the borehole are taken at each of several selected depth intervals. Each of the two fluxgate magnetometer sensors measures the total magnetic field component parallel to its axis of sensitivity, and by placing these sensors at right angles to each other within the sonde, the X and Y axis vector components of the total magnetic field in the XY plane in the borehole are measured.

Each of the fluxgate magnetometer devices produces an output signal which corresponds to the vector component of the total magnetic field along the axis of sensitivity of its sensor. Because fluxgate magnetometers are extremely sensitive to very small magnetic fields, the output from each magnetometer sensor at any given time is a measure of the instantaneous total of the earth's magnetic field component, any background magnetic fields, and the imposed time varying field component along the sensor's axis of sensitivity. Except when the sonde is quite close to a conductive anomaly carrying a relatively large current, the imposed time varying magnetic field will normally be quite small in comparison to the magnitude of the earth's magnetic field. Accordingly, to enhance the response of the sonde to the total field, the outputs of the X and Y axis sensors are fed to corresponding signal conditioning amplifiers which have a resonance at the frequency of the alternating current which produces the time varying magnetic field of interest. These amplifiers act as active filters to boost the time-varying components of the X and Y axis total field component signals with respect to their static field components to equalize the voltage amplitude of these components and to produce for each axis a single, composite output signal which varies in accordance with variations in, and is proportional to, the total magnetic field to be detected. In a preferred form of the invention, a detector and null circuit is interposed between each of the sensor devices and its signal conditioning amplifier to isolate the drive signals, which energize the fluxgate magnetometer sensors, from the respective amplifiers.

The composite output signals from the X axis and Y axis signal conditioning amplifiers are connected to a multiplexer which alternately connects the outputs of the magnetometers to the input of an analog to digital (A/D) converter. The multiplexed signals are sampled by the A/D converter, which produces corresponding digitally encoded output signals. These digital signals are connected to a universal asynchronous receiver and transmitter (UART) for serial encoding and transmission from the sonde to a remote receiver having suitable decoding and processing circuitry. When the sonde is used to measure magnetic fields in a borehole, the digital signals are transmitted along a line in the wireline cable which also supports the sonde and are received at the surface by a corresponding UART device for decoding and processing by a computer. The magnetometer outputs are alternately sampled at a constant rate which is controlled by a crystal oscillator in the sonde to simplify subsequent Fourier analysis and deconvolving of the signals at the surface.

The signals which are transmitted from the sonde represent the X and Y axis vector components of the total magnetic fields at the sensor; there is no separation of the static field component from the time varying field component. As a result, less circuitry is required in the downhole environment, few channels are required for handling the output signals, and accordingly, more accurate information can be obtained by the system of the present invention than previously was possible with systems of this type.

BRIEF DESCRIPTION OF THE DRAWINGS

The foregoing and additional objects, features, and advantages of the present invention will become apparent to those of skill in the art from the following detailed description thereof taken in conjunction with the accompanying drawings, in which:

FIG. 5 is a schematic diagram of a signal conditioning amplifier used in the circuit of FIG. 4; and FIG. 6 is a curve illustrating the frequency response of the circuit of FIG. 5.

DESCRIPTION OF A PREFERRED EMBODIMENT

Figure 1:
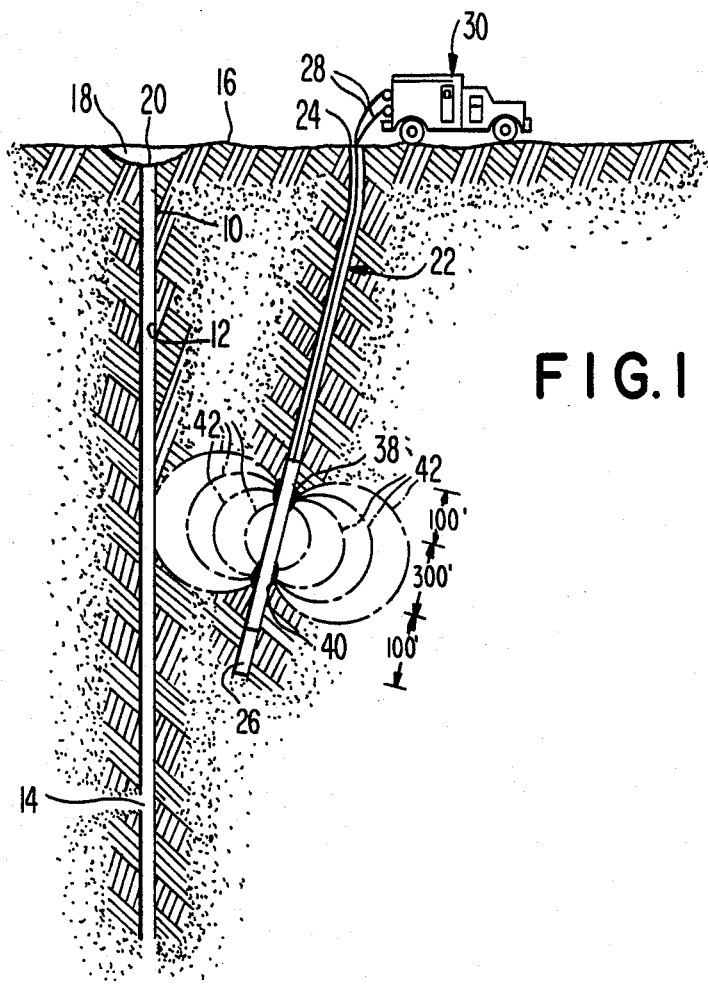
FIG. 1 is a diagrammatic illustration of apparatus for locating an electrically conductive target anomaly such as a well casing, utilizing the magnetometer arrangement of the present invention.
Figure 2:
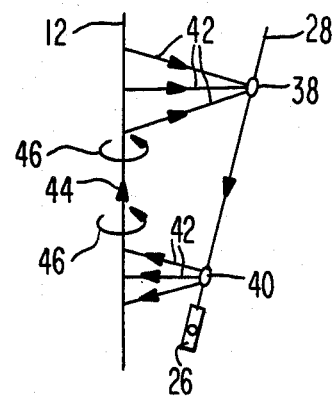
FIG. 2 is a more detailed diagrammatic illustration of the device of FIG. 1.

Apparatus in accordance with the present invention for the detection of target subterranean, electrically conductive anomalies is illustrated diagrammatically in FIGS. 1 and 2, to which reference is now made. As an example of one application of the present invention the electrically conductive anomaly may be a well bore 10 in which is located a steel casing 12 which extends some arbitrary distance below the surface 16 of the earth. In FIG. 1 the well bore represents a blown-out well in which a rupture 14 has occurred, resulting in an explosion which has produced a crater 18 around the wellhead 20, making the wellhead inaccessible. To plug the well 10, a relief well 22 is directed to intersect the original, or target, well 10 at a selected depth. The relief well 22 is drilled from a relief wellhead 24 which may be a considerable distance away from the wellhead 20. As a result, the relief well 22 must be drilled at complex angles which, for example, may cause it to travel straight down for a distance, then curve towards an intersection with the target well 10 at its assumed location at the selected depth. Since the exact location of the target well is unknown, and since drilling errors occur in the drilling of the relief well, ordinary drilling tolerances could result in the relief well 22 terminating 200 feet or more away from the target well 10 in the absence of extremely accurate methods of guidance such as those set forth in U.S. Pat. No. 4,372,398 and as further improved by the circuitry described and claimed herein.

For the initial drilling of the relief well 22, conventional surveying techniques provide satisfactory guidance to the drillers. However, as the relief well approaches to within 150 or 200 feet of the target well, more accurate measurements are required. Accordingly, as the relief well is drilled, the drill string is periodically withdrawn from the borehole 22 and a surveying tool, or sonde 26, which is secured to a conventional well-logging cable, or wireline 28, is lowered down the borehole 22 by means of conventional well logging equipment at vehicle 30. The sonde 26 incorporates magnetic field detectors such as a pair of fluxgate magnetometers incorporating ring-type magnetic field sensors generally indicated at 32 and 33 (see FIG. 3) which include sensor windings 34 and 35, respectively, arranged at right angles to each other to define X and Y axes of a reference plane. The reference plane is perpendicular to the longitudinal axis 36 of the sonde, and usually is generally horizontal. The X axis and Y axis output windings 34 and 35 produce output signals proportional to corresponding X or Y vector components of the total magnetic field present in the relief well 22 at the location of the sonde, and these output signals, after processing to be described, are sent to the well logging vehicle 30 at the surface where the signals are further processed for use in determining the direction and distance from the sonde to the source of the magnetic field being detected.

It will be understood that although FIG. 1 illustrates the target, which is the source of the magnetic field being detected, as being the steel casing in a blowout well, the target may be some other anomaly in the earth having an electrical conductivity different from surrounding formations. A conductive anomaly tends to collect current injected into the earth, as from a source such as a pair of electrodes in contact with the earth, so that the collected current produces a magnetic field which can be detected by the sensors. The intensity of the detected field, and the apparent direction from the sonde to the current which produces the field permits an accurate calculation of the relative location of the target anomaly. This calculation then permits directional drilling of the relief well into the anomaly in the manner described in the aforementioned U.S. Pat. No. 4,372,398.

One component of the magnetic field to be detected by the fluxgate magnetometer sensors 32 and 33 in sonde 26 is the time varying field which is produced by a time varying current flowing in the electrically conductive anomaly, such as the casing 12. This time varying field results from the injection of current having known time varying characteristics into the earth surrounding the relief well and the target well. As described in U.S. Pat. No. 4,700,142, the time-varying current can be injected into the earth in a variety of ways, but for purposes of illustration, a pair of electrodes 38 and 40 may be used. These electrodes are shown in FIG. 1 as being secured to the well-logging cable 28. The cable is electrically insulated, with the electrodes 38 and 40 being secured so as to contact the sides of the borehole 22, which is uncased. Upon application of current to the electrodes, that current is injected into the earth surrounding the well 22, as illustrated by the lines 42 in FIG. 1.

The current is injected into the ground symmetrically around the relief well 22 so that normally the magnetometer sensors 32 and 33 in sonde 26 are not affected by magnetic fields produced by this current flow. However, if a part of the current is intercepted by, and flows in, the casing 12 of the target or in any other anomaly having an electrical conductivity which is higher than that of the surrounding strata, current will be concentrated in that anomaly, resulting in a target current flow 44 diagrammatically illustrated in FIG. 2. The current 44 collected by the conductive anomaly interrupts the symmetry of the current paths 42, with the result that the concentrated current flow in the target generates a circumferential magnetic field which varies in accordance with the time variation of the current 44. This time varying imposed magnetic field circulates around the target in the manner illustrated by arrows 46 for current flowing upwardly in the well casing and in the opposite direction for current flowing downwardly. The magnetic field lines generated by the current flow in target 12 lie in planes perpendicular to the axis of the current flow; in the case of a vertical anomaly such as well 10, these magnetic field lines will be generally horizontal. The magnetic field generated by that portion of the target current which is in the region of sonde 26 will be detected by the magnetometer sensors 32 and 33 in the sonde. The fields produce on windings 34 and 35, respectively, electric signals corresponding to the X axis and Y axis vector components of the total magnetic field lying in a plane perpendicular to the axis 36 of the sonde; thus, the magnetometers detect the vector components of any time varying magnetic fields as well as any static, or essentially static, magnetic fields such as the earth's magnetic field, fields due to any remanent magnetism in the target, and the like, with the outputs of the two magnetometer sensors representing, at any given instant, the instantaneous magnitude of the respective total magnetic field vector components in the region of the sonde.

The current flow on the target anomaly is time varying in a preselected pattern so that the time varying portion of the total magnetic field observed at the sonde 26 can be distinguished not only from the much larger ambient, essentially static, magnetic fields such as the earth's magnetic field, but from other background fields which may be present. A current of approximately 80 amperes at a frequency of between about 0.25 Hz and 2.0 Hz may be injected into the ground by the electrodes 38 and 40 to produce about 30 miliamperes of current flow on a target anomaly such as a well casing, and such a current can be expected to produce a time varying imposed magnetic field of approximately 200 milligammas at a distance of about 100 feet from the target anomaly. Such a field is easily detectable by fluxgate magnetometer sensors 32 and 33.

Figure 3:
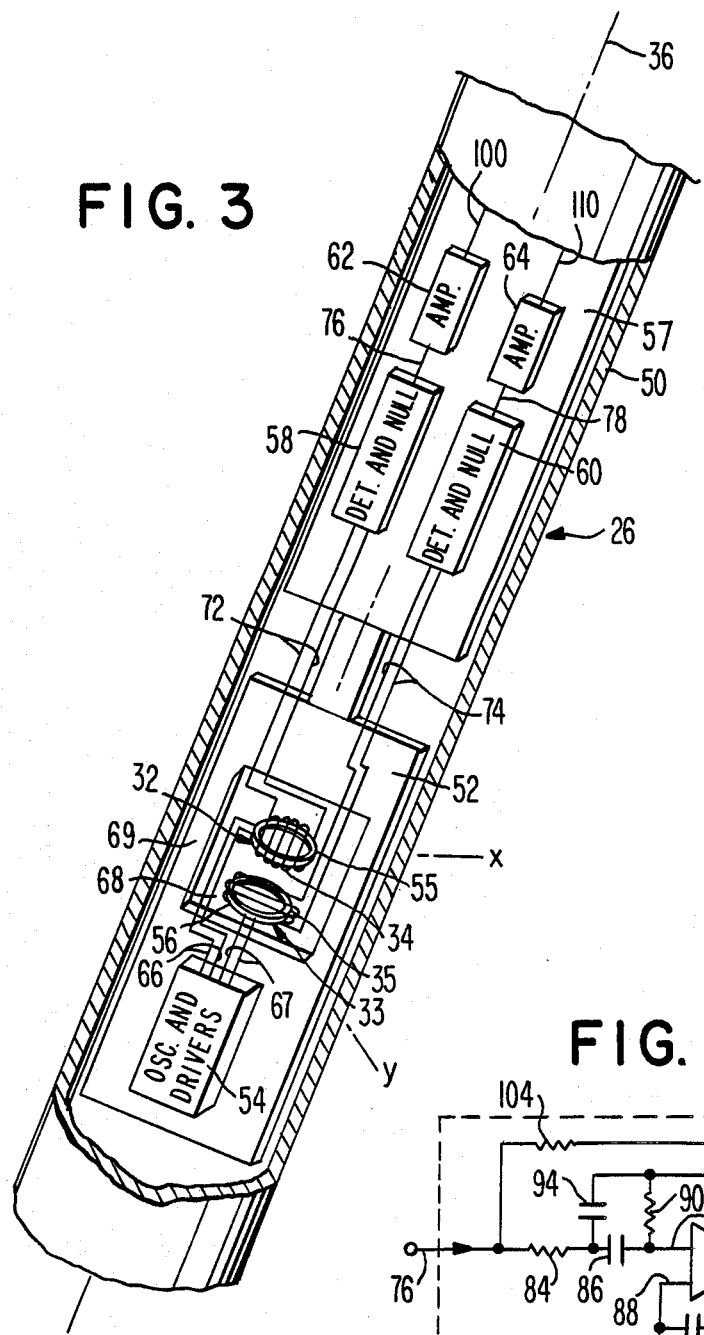
FIG. 3 is a diagrammatic, partial cross sectional view of a sonde utilizing the circuitry of the present invention.

FIG. 3 illustrates in partial cross-section and in diagrammatic perspective form, a sonde 26 incorporating the circuit features of the present invention. The unit 26 comprises a housing 50 which receives a series of circuit boards such as board 52 in which the magnetometer sensors 32 and 33 may be mounted so as to be perpendicular to axis 36. The particular manner of such mounting is not a part of this invention, but is conventional and not shown. Board 52 may also carry an electronics package 54 consisting of conventional oscillator and driver circuitry which form a part of the magnetometers and which energize the two magnetometer sensors by way of toroidal coils 55 and 56 wound on ring cores. At the upper end of circuit board 52 is a second circuit board 57 on which is mounted additional circuitry such as detector and null circuits 58 and 60 connected to the output windings 34 and 35 of the X and Y axis magnetometer sensors 32 and 33, respectively. The outputs of the detector circuits 58 and 60 are connected to the inputs of corresponding signal conditioning circuits 62 and 64, also mounted on board 57. The outputs of the circuits 62 and 64 are connected, in turn, to transmitter circuitry for transmission of the data provided by the two magnetometers to a remote receiver, as will be described below in greater detail.

The housing 50 preferably is a double-walled vacuum container for maintaining the temperature within the sonde at a relatively constant level during measurements so as to prevent temperature drift of the electronic circuitry. The outer diameter of the housing is sufficiently small to move easily within the borehole 22 and the wall is constructed of a nonmagnetic metal to provide the strength necessary for the borehole environment, while permitting detection of the surrounding magnetic fields. The circuit boards 52 and 57 may be secured together in any convenient fashion, and additional circuit boards for the remaining transmitter circuitry is provided in the housing 50, as required. The sensors 32 and 33 are secured to the circuit board 52 so their sensing windings 34 and 35 are at right angles to each other and at right angles to the longitudinal axis 36 of the sonde, as previously explained, so that one sensor, such as sensor 32, will measure the X axis component of the total magnetic field to which it is exposed while the other sensor, such as the sensor 33, will measure the Y axis component of the total magnetic field.

As shown, the sensors 32 and 33 are distinct devices, each carrying a single sensor output winding. The exciting and bias windings are toroidally wound around the ring core for each device with each output winding being wound in a single direction around the outer diameter of its respective ring core. Other fluxgate magnetometer sensors can be used, if desired. For example, a single ring core can be used, with two outer sensor windings being wound around the outer diameter, one sensor winding being wound on top of the other, with their axes being at right angles to each other.

Figure 4:
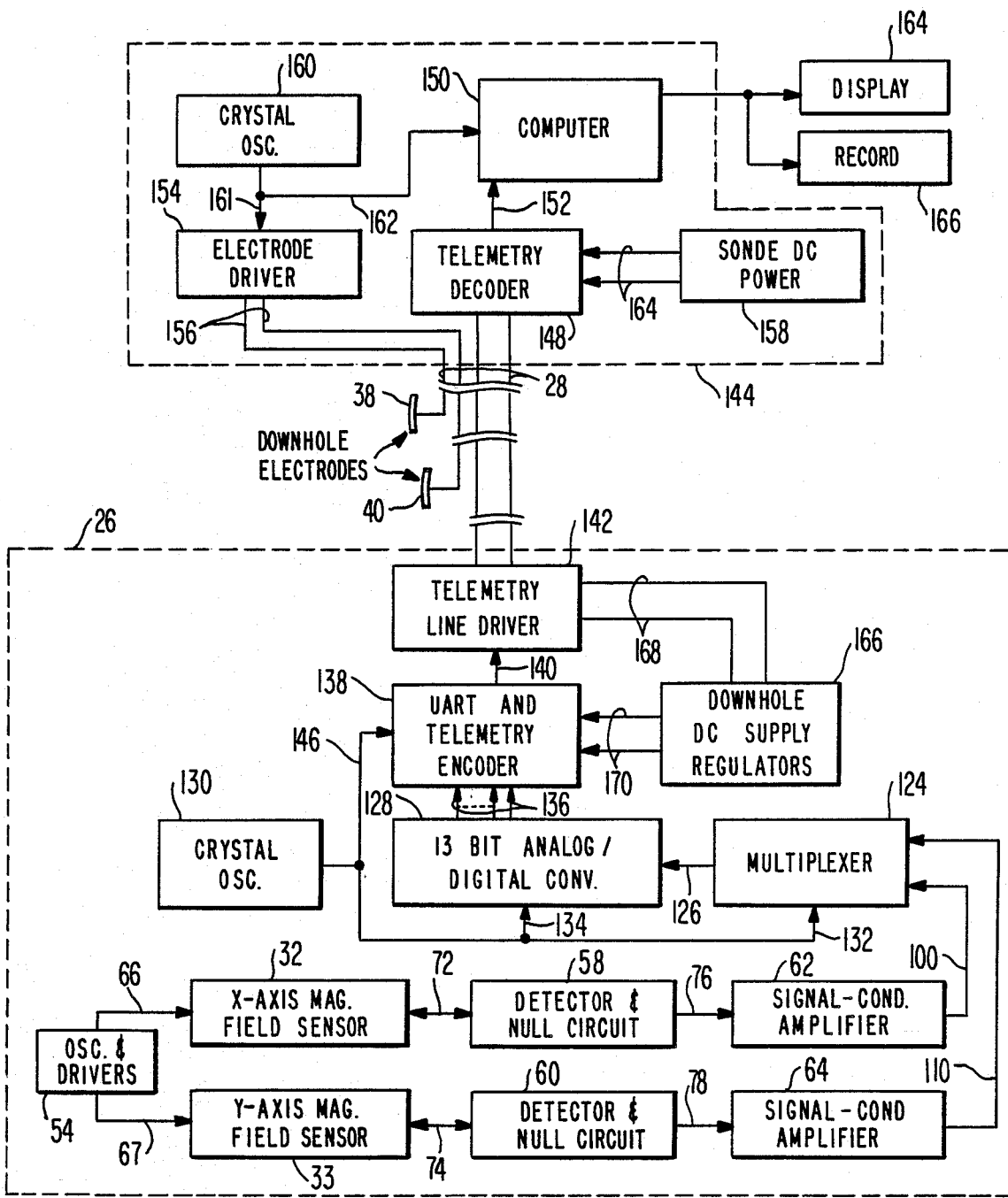
FIG. 4 is a block diagram of the circuitry used in conjunction with the sonde of FIG. 3.

The electrical circuitry for the present system is illustrated in greater detail in FIGS. 4 and 5, to which reference is now made. The magnetometers for the device include oscillator and driver networks in the electronics package 54, which are connected by way of lines 66 and 67 to corresponding toroidal driver windings 55 and 56 on the X and Y axis magnetometer sensors 32 and 33, respectively. The output signal from oscillator package 54 drives the magnetometer sensor ring cores, which are of a ferromagnetic material exhibiting a square hysteresis loop, into and out of saturation, in known manner, at a frequency of about 16 KHz, for example. The magnetometers are balanced so as normally to produce no net output signal. However, the two ring cores are sensitive to the total ambient magnetic field in the vicinity of the sonde so that the time in each cycle when each core reaches saturation is modified in accordance with the ambient field. As a result, each sensor produces an output signal on its output winding 34 or 35, respectively, by way of lines 72 and 74, which signal is a measure of the total field vector parallel to the axis of maximum sensitivity to the magnetometer.

The signals on lines 72 and 74 are fed to the corresponding detector and null circuits 58 and 60, which provide feedback signals to the respective sensors. These feedback signals are equal and opposite to the output signals produced by the sensors, thereby nulling the sensors. The nulling feedback signals are also supplied via lines 76 and 78 to signal conditioning amplifiers 62 and 64, respectively.

Each of the circuits 62 and 64 is, in effect, a bandpass active filter which has a greatly enhanced gain at the frequency of the alternating current supplied to the downhole electrodes 38 and 40 and thus at the frequency of the time varying magnetic field produced by alternating current flow in the target anomaly. The signal conditioning circuit 62 is identical to circuit 64, with 62 being illustrated in detail in FIG. 5. In a preferred form of the invention, circuit 62 includes an amplifier 80 having one of its inputs 82 connected to line 76 through a resistor 84 and a series capacitor 86, and its other input 88 connected to ground. A feedback resistor 90 is connected in a feedback loop between the output 92 and the input 82 of amplifier 80, and a second capacitor 94 is connected between output lines 92 and the junction between capacitor 86 and resistor 84. The output line 92 from amplifier 80 is connected through a voltage divider consisting of a pair of resistors 96 and 98, with the output signal from circuit 62 being supplied to an output line 100 which is connected to the junction 102 of resistors 96 and 98. Input line 76 is also connected to output line 100 by way of a bypass resistor 104 to provide a bypass loop 106 around the amplifier 80. The circuit 62, and the circuit 64, each have a frequency response characteristic such as that illustrated in FIG. 6 by curve 108.

The output signal from the detector and null circuit 58 applied by way of line 76 to circuit 62 is a total field signal which includes both DC and AC voltages representing a vector component of the static earth's magnetic field and of the superimposed alternating magnetic field vector. The total field signal on line 76 is fed through bypass loop 106 to the output line 100 of circuit 62, and is reduced in amplitude by the resistor 104. The AC signal component only of the total field signal on line 76 is supplied to the amplifier 80, through resistor 84, blocking capacitors 86 and 94, and resistor 90. The circuit 62 has a resonant peak amplification at a selected frequency $f_o$, and reduced amplification at adjacent frequencies, as illustrated by curve 108 in FIG. 6. The frequency $f_o$ is selected to be the frequency of the alternating current supplied to the electrodes 38 and 40. The resonant peak response characteristic of the bypass active filter/amplifier 62 serves to boost signals of the desired band of frequencies, while reducing the level of signals outside the desired frequency range. The amplified AC signal is recombined with the reduced total field signal in bypass loop 106 at output line 100 to produce a composite total field signal representing the X-axis component of the sensed magnetic field in which AC component at the frequency of interest has been boosted with respect to the DC component.

Although circuit 62 is illustrated as having a single-stage active filter/amplifier, a second stage can be added, if desired, to improve the resonant characteristics of the circuit.

Signal conditioning circuit 64 produces a composite total field output signal representing the Y-axis component of the sensed magnetic field on its output line 110 in the manner described with respect to FIGS. 5 and 6. The frequency characteristics of circuits 62 and 64 serve to condition the total field signals from the magnetometer sensors by boosting time varying components of a predetermined frequency produced by varying fields in the region of the magnetometers 32 and 33 with respect to the direct current components produced by essentially static fields such as the earth's magnetic field in the region of the sensors. The output signals on lines 100 and 110 are composite signals representing the total X and Y axis magnetic field vector components measured by the respective magnetometer sensors, but with the static component reduced with respect to the preselected frequency time varying component.

The signal on line 100 representing the total magnetic field vector component along the X axis of the sonde and the signal on line 110 representing the total magnetic field vector component along the Y axis of the sonde are supplied to transmitter circuitry which includes a multiplexer 124. This multiplexer alternately switches the signals appearing on lines 100 and 110 by way of line 126 to a 13-bit analog to digital (A/D) converter 128. The timing of the multiplexer and A/D converter are controlled by a crystal oscillator 130, the output of which is supplied by way of line 132 to the multiplexer and also by way of line 134 to the analog to digital converter 128. The output of the A/D converter 128 is supplied by way of eight lines, represented by cable 136, to an encoder associated with a universal asynchronous receiver and transmitter (UART) unit 138 which takes each 13-bit output of the A/D converter and generates two 8-bit, serially encoded words having parity bits for error checking at a remote receiver. The output from encoder 138 is supplied, in the present embodiment, through line 140 to a line driver circuit 142, which modulates the current supplied to the sonde 26 from a surface power supply which is connected by way of wireline 28 from the remote receiving equipment 144 at the earth's surface. The encoder 138 is driven by the crystal oscillator 130 by way of line 146.

Although the multiplexer 124 is shown as having only two input channels, it will be understood that additional channels are provided for monitoring the temperature of the sonde, the voltage of the power supply, and other such parameters. The equipment located in the sonde operates continuously during a measurement cycle, with the multiplexer taking data once from all of the input channels sequentially, and thereafter alternately sampling only the lines 100 and 110 during a cycle. These two lines are sampled over a relatively long period of time in order to obtain stable and reliable readings of the X axis and Y axis components of the total magnetic field. Upon completion of a measurement at a given location within the borehole 22, the sonde may be moved to another location and the cycle repeated.

The surface apparatus includes, in addition to the wireline-handling equipment previously described, the signal processing electronics generally indicated at 144 in FIG. 4. This equipment includes a decoder 148 which receives the signal from the downhole line driver 142, a computer 150 for processing data received by way of line 152 from the decoder 148, an electrode driver 154 which operates as the AC source for current supplied to the electrodes 38 and 40 by way of lines 156 in wireline 28, and a DC power supply 158 for operating the downhole electronics. A crystal oscillator 160 provides clocking signals to the computer and to the electrode driver by way of lines 161 and 162. In the embodiment illustrated, DC power is supplied to the downhole electronics from power supply 158 by way of lines 164 and the wireline 28, with the downhole unit including a current and voltage regulator 166 connected to line 28 by way of leads 168 and to the encoder 138 and other downhole electronics by suitable lines such as those illustrated at 170.

The data signals fed to wireline 28 by the downhole line driver 142, are received by the remote (surface) decoder 148, which decodes the 8-bit words generated at encoder 138. The output digital signals from the decoder 148 are fed into the computer, which identifies the data and notes the time of arrival with respect to the timing edges supplied by the crystal oscillator 160 by way of line 162. Oscillator 160 also controls the phase of the alternating current being sent to the electrodes 38 and 40 by way of control lead 161. The computer produces a Fourier analysis of the total field signals supplied by the X axis and Y axis magnetometers and generates data indicating the apparent distance and the apparent direction to the source of the detected time varying magnetic field from the sonde 26. This information is provided for each cycle of the downhole electronics. The output signals representing the apparent distance and the apparent direction to the source are fed to a display unit 164 such as a printer and are recorded on a magnetic disk 166. The manner in which the computer determines the direction and distance of the target source is described in U.S. Pat. No. 4,372,398, the disclosure of which is hereby incorporated herein by reference.

The use of two fluxgate magnetometers to measure total field components in the X and Y directions and the delivery of the two resulting total field output signals by way of multiplexer and A/D converter circuitry to the surface electronics produces significant advantages over prior magnetic field detection systems. The fact that only two output signals are needed simplifies the circuitry and by permitting the multiplexer to cycle between only two signals, the circuit provides a more accurate and reliable reading of the magnetic field components for use by the computer. The use of a composite total field signal eliminates the need for separating the alternating and the static field components from each other in the downhole electronics where the circuitry is subject to wide temperature variations which can distort the readings and produce inaccuracies in the distance and direction determinations.

Although the present invention has been described in terms of a preferred embodiment, it will be apparent that variations and modifications may be made without departing from the true spirit and scope thereof, as set forth in the following claims.

What is claimed is:

1. Apparatus for locating subterranean electrically conductive anomalies, comprising:
   means for injecting current having a predetermined time-varying characteristic into the earth in the region of an anomaly to produce a corresponding current flow in the anomaly and to thereby produce a corresponding time-varying magnetic field surrounding the anomaly and superimposed on the ambient magnetic field;
   a sonde for measuring the magnetic field near the anomaly, the sonde having a longitudinal axis and including
   (a) first and second fluxgate magnetometers each having a single sensor with an axis of sensitivity, the sensor axes being at right angles to each other to define an X axis sensor and a Y axis sensor, said X and Y sensor axes being perpendicular to said longitudinal axis,
   (b) oscillator means connected to drive said X and Y axis sensors,
   (c) X axis and Y axis detector and null circuit means connected to said X axis and Y axis sensors, respectively, to receive output signals from said sensors representing the X axis and Y axis components, respectively, of the total magnetic field at said sonde and to produce corresponding X axis and Y axis null feedback signals to said sensors, said feedback signals representing the X axis and Y axis components of said total magnetic field,
   (d) X axis and Y axis signal conditioning circuits responsive to said X axis and Y axis feedback signals respectively, for conditioning the time varying and the static components of the respective feedback signals, to produce corresponding composite modified field component signals,
   (e) transmitter circuit means for selecting and digitizing said X axis and Y axis composite modified field component signals and for transmitting said digitized signals to a remote location; and
   (f) receiver means at said remote location responsive to said digitized signals for determining, from said signals representing said X axis and Y axis modified field components, the distance and direction to said anomaly from said sonde location.

2. The apparatus of claim 1, wherein each said signal conditioning circuit is an active bandpass filter having a low gain for signals representing essentially static magnetic fields and having a maximum gain for signals having said predetermined time-varying characteristic.

3. The apparatus of claim 1, wherein each said signal conditioning circuit comprises:
   (a) AC amplifier and filter means having an input and an output, and including DC blocking means in series with said input, said amplifier and filter means having a resonant peak at the frequency of said time-varying magnetic field; and
   (b) bypass means in parallel with said amplifier and filter means.

4. The apparatus of claim 3, wherein said bypass means includes a resistor connected between the input and the output of said AC amplifier and filter means.

5. The apparatus of claim 4, wherein said AC amplifier and filter means includes an amplifier having a feedback loop including a resistor and a capacitor.

6. The apparatus of claim 3, wherein said bypass means is a DC bypass including resistor means for reducing DC components of said feedback signals.

7. The apparatus of claim 1, wherein each said signal conditioning circuit comprises:
   an input connected to receive said feedback signals, and an output;
   AC amplifier and filter means connected between said input and said output to amplify AC signals having said predetermined time-varying characteristic, and including DC blocking means; and
   bypass means connected between said input and said output for supplying said feedback signals to said output, said AC amplifier and filter means and said bypass means being connected to said output to produce at the output a composite modified field component signal wherein signals having said predetermined time-varying characteristics are amplified with respect to the said feedback signal.

8. The apparatus of claim 7, wherein said bypass means is a DC bypass including resistive means for reducing the amplitude of said feedback signals.

* * * * *